United States Patent
Dunn

(10) Patent No.: US 9,030,641 B2
(45) Date of Patent: May 12, 2015

(54) HEAT EXCHANGER FOR BACK TO BACK ELECTRONIC DISPLAYS

(71) Applicant: Manufacturing Resources International, Inc., Alpharetta, GA (US)

(72) Inventor: William R. Dunn, Alpharetta, GA (US)

(73) Assignee: Manufacturing Resources International, Inc., Alpharetta, GA (US)

(*) Notice: Subject to any disclaimer, the term of this patent is extended or adjusted under 35 U.S.C. 154(b) by 0 days.

(21) Appl. No.: 13/692,657

(22) Filed: Dec. 3, 2012

(65) Prior Publication Data

US 2013/0279154 A1     Oct. 24, 2013

Related U.S. Application Data

(63) Continuation of application No. 12/753,298, filed on Apr. 2, 2010, now Pat. No. 8,351,014, and a continuation-in-part of application No. 12/641,468, filed on Dec. 18, 2009, now Pat. No. 8,654,302, said (Continued)

(51) Int. Cl.
*H05K 7/20* (2006.01)
*G02F 1/1333* (2006.01)
*F21V 29/02* (2006.01)

(Continued)

(52) U.S. Cl.
CPC .............. *H05K 7/20154* (2013.01); *F28D 9/00* (2013.01); *F28F 3/02* (2013.01); *G02F 1/133385* (2013.01); *H05K 7/20972* (2013.01); *F21V 29/02* (2013.01)

(58) Field of Classification Search
CPC ................ G02F 1/133385; H05K 7/20154; H05K 7/20136; H05K 7/202; H05K 7/20972; H05K 7/20145

USPC .................................. 349/161; 361/694–697
See application file for complete search history.

(56) References Cited

U.S. PATENT DOCUMENTS

| 4,093,355 A | 6/1978 | Kaplit et al. |
| 4,593,978 A | 6/1986 | Mourey et al. |
| 4,634,225 A | 1/1987 | Haim et al. |

(Continued)

FOREIGN PATENT DOCUMENTS

| GB | 2402205 | 1/2004 |
| JP | 03153212 | 7/1991 |

(Continued)

OTHER PUBLICATIONS

Nagoya Electric Works Co Ltd, May 26, 2005, Machine Translation of JP 2005-134849 A from JPO AIPN website, pp. 1-13.*

(Continued)

*Primary Examiner* — Dennis Y Kim
(74) *Attorney, Agent, or Firm* — Standley Law Group LLP

(57) ABSTRACT

A cooling assembly for a dual electronic image assembly having an open and closed gaseous loop. A closed gaseous loop allows circulating gas to travel across the front surface of a pair of electronic image assemblies and through a heat exchanger. An open loop allows ambient gas to pass through the heat exchanger and extract heat from the circulating gas. An optional additional open loop may be used to cool the back portion of the electronic image assembly (optionally a backlight). The cooling assembly can be used with any type of electronic assembly for producing an image. Some embodiments use cross-flow heat exchangers comprised of corrugated plastic.

20 Claims, 5 Drawing Sheets

Related U.S. Application Data application No. 12/753,298 is a continuation-in-part of application No. 12/411,925, filed on Mar. 26, 2009, now Pat. No. 8,854,595, said application No. 12/753,298 is a continuation-in-part of application No. 12/556,029, filed on Sep. 9, 2009, now Pat. No. 8,373,841, said application No. 12/753,298 is a continuation-in-part of application No. 12/234,307, filed on Sep. 19, 2008, now Pat. No. 8,767,165, said application No. 12/753,298 is a continuation-in-part of application No. 12/234,360, filed on Sep. 19, 2008, said application No. 12/753,298 is a continuation-in-part of application No. 12/237,365, filed on Sep. 24, 2008, now Pat. No. 8,879,042, said application No. 12/753,298 is a continuation-in-part of application No. 12/235,200, filed on Sep. 22, 2008, said application No. 12/753,298 is a continuation-in-part of application No. 12/620,330, filed on Nov. 17, 2009, now Pat. No. 8,274,622, said application No. 12/753,298 is a continuation-in-part of application No. 12/556,209, filed on Sep. 9, 2009, now Pat. No. 8,379,182, said application No. 12/753,298 is a continuation-in-part of application No. 12/706,652, filed on Feb. 16, 2010, now Pat. No. 8,358,397, said application No. 12/753,298 is a continuation-in-part of application No. 12/630,469, filed on Dec. 3, 2009, now Pat. No. 8,497,972, and a continuation-in-part of application No. 12/234,182, filed on Sep. 19, 2008, now Pat. No. 8,711,321.

(60) Provisional application No. 61/252,295, filed on Oct. 16, 2009, provisional application No. 61/138,736, filed on Dec. 18, 2008, provisional application No. 61/039,454, filed on Mar. 26, 2008, provisional application No. 61/095,615, filed on Sep. 9, 2008, provisional application No. 61/033,064, filed on Mar. 3, 2008, provisional application No. 61/053,713, filed on May 16, 2008, provisional application No. 61/057,599, filed on May 30, 2008, provisional application No. 61/076,126, filed on Jun. 26, 2008, provisional application No. 61/115,333, filed on Nov. 17, 2008, provisional application No. 61/095,616, filed on Sep. 9, 2008, provisional application No. 61/152,879, filed on Feb. 16, 2009, provisional application No. 61/033,064, filed on Mar. 3, 2008.

(51) Int. Cl.
  *F28D 9/00* (2006.01)
  *F28F 3/02* (2006.01)

(56) References Cited

U.S. PATENT DOCUMENTS

| | | | |
|---|---|---|---|
| 5,029,982 A | 7/1991 | Nash | |
| 5,088,806 A | 2/1992 | McCartney et al. | |
| 5,247,374 A | 9/1993 | Terada | |
| 5,559,614 A | 9/1996 | Urbish et al. | |
| 5,748,269 A | 5/1998 | Harris et al. | |
| 5,767,489 A | 6/1998 | Ferrier | |
| 5,818,010 A | 10/1998 | McCann | |
| 5,869,919 A | 2/1999 | Sato | |
| 5,991,153 A | 11/1999 | Heady et al. | |
| 6,089,751 A | 7/2000 | Conover et al. | |
| 6,157,432 A | 12/2000 | Helbing | |
| 6,191,839 B1 | 2/2001 | Briley | |
| 6,392,727 B1 | 5/2002 | Larson et al. | |
| 6,417,900 B1 | 7/2002 | Shin et al. | |
| 6,428,198 B1 | 8/2002 | Saccomanno | |
| 6,493,440 B2 | 12/2002 | Gromatzky | |
| 6,535,266 B1 | 3/2003 | Nemeth et al. | |
| 6,628,355 B1 | 9/2003 | Takahara | |
| 6,839,104 B2 | 1/2005 | Taniguchi et al. | |
| 6,885,412 B2 | 4/2005 | Ohnishi et al. | |
| 6,909,486 B2 | 6/2005 | Wang et al. | |
| 6,943,768 B2 | 9/2005 | Cavanaugh et al. | |
| 6,961,108 B2 | 11/2005 | Wang et al. | |
| 7,059,757 B2 | 6/2006 | Shimizu | |
| 7,083,285 B2 | 8/2006 | Hsu | |
| 7,284,874 B2 | 10/2007 | Jeong et al. | |
| 7,480,140 B2 | 1/2009 | Hara et al. | |
| 7,752,858 B2 | 7/2010 | Johnson | |
| 2001/0001459 A1 | 5/2001 | Savant et al. | |
| 2001/0019454 A1 | 9/2001 | Tadic-Galeb | |
| 2002/0033919 A1 | 3/2002 | Sanelle | |
| 2002/0101553 A1 | 8/2002 | Enomoto et al. | |
| 2002/0126248 A1 | 9/2002 | Yoshida | |
| 2002/0149714 A1 | 10/2002 | Anderson | |
| 2002/0164944 A1* | 11/2002 | Haglid | 454/228 |
| 2003/0007109 A1 | 1/2003 | Park | |
| 2003/0104210 A1 | 6/2003 | Azumi | |
| 2004/0036834 A1 | 2/2004 | Ohnishi et al. | |
| 2004/0105159 A1 | 6/2004 | Saccomanno | |
| 2004/0165139 A1 | 8/2004 | Anderson et al. | |
| 2005/0012722 A1 | 1/2005 | Chon | |
| 2005/0073632 A1 | 4/2005 | Dunn | |
| 2005/0213950 A1 | 9/2005 | Yoshimura | |
| 2005/0286131 A1 | 12/2005 | Saxena | |
| 2006/0012985 A1 | 1/2006 | Archie | |
| 2006/0018093 A1 | 1/2006 | Lai | |
| 2006/0082271 A1 | 4/2006 | Lee | |
| 2006/0092346 A1* | 5/2006 | Moon et al. | 349/61 |
| 2006/0092348 A1 | 5/2006 | Park | |
| 2006/0132699 A1 | 6/2006 | Cho | |
| 2006/0177587 A1 | 8/2006 | Ishizuka | |
| 2006/0199514 A1 | 9/2006 | Kimura | |
| 2006/0209266 A1 | 9/2006 | Utsunomiya | |
| 2006/0260790 A1* | 11/2006 | Theno et al. | 165/166 |
| 2006/0283579 A1 | 12/2006 | Ghosh | |
| 2007/0019419 A1 | 1/2007 | Hafuka et al. | |
| 2007/0103866 A1 | 5/2007 | Park | |
| 2007/0140671 A1 | 6/2007 | Yoshimura | |
| 2007/0151664 A1 | 7/2007 | Shin | |
| 2007/0206158 A1 | 9/2007 | Kinoshita | |
| 2007/0212211 A1 | 9/2007 | Chiyoda | |
| 2009/0086430 A1* | 4/2009 | Kang et al. | 361/695 |
| 2009/0126906 A1 | 5/2009 | Dunn | |
| 2009/0154096 A1 | 6/2009 | Iyengar | |
| 2010/0182562 A1 | 7/2010 | Yoshida | |
| 2011/0013114 A1 | 1/2011 | Dunn | |

FOREIGN PATENT DOCUMENTS

| | | | |
|---|---|---|---|
| JP | 08194437 | 7/1996 | |
| JP | 11160727 | 6/1999 | |
| JP | 2001209126 | 8/2001 | |
| JP | 2002158475 | 5/2002 | |
| JP | 2005134849 | 5/2005 | |
| JP | 2005-265922 | 9/2005 | |
| JP | 09307257 | 11/2007 | |
| JP | 200829274 | 12/2008 | |
| KR | 20060016469 | 2/2006 | |
| KR | 100666961 | 1/2007 | |
| KR | 1020070070675 | 7/2007 | |
| WO | WO2005079129 | 8/2005 | |
| WO | WO 2009135308 A1 * | 11/2009 | G09F 9/30 |
| WO | WO2010-007821 | 1/2010 | |

OTHER PUBLICATIONS

Zeef, Hubing, EMC analysis of 18' LCD Monitor, Aug. 2000, 1 page.

\* cited by examiner

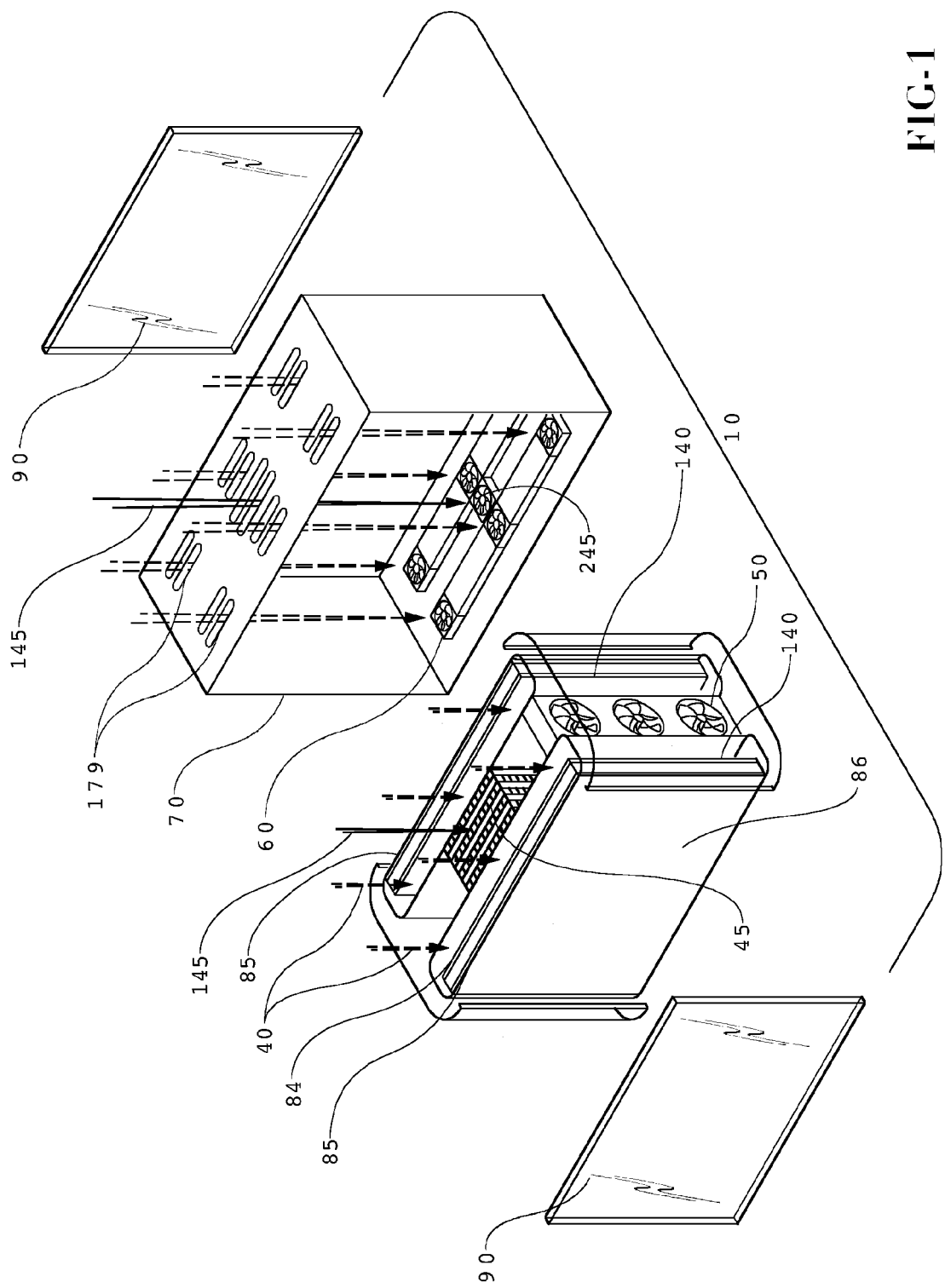

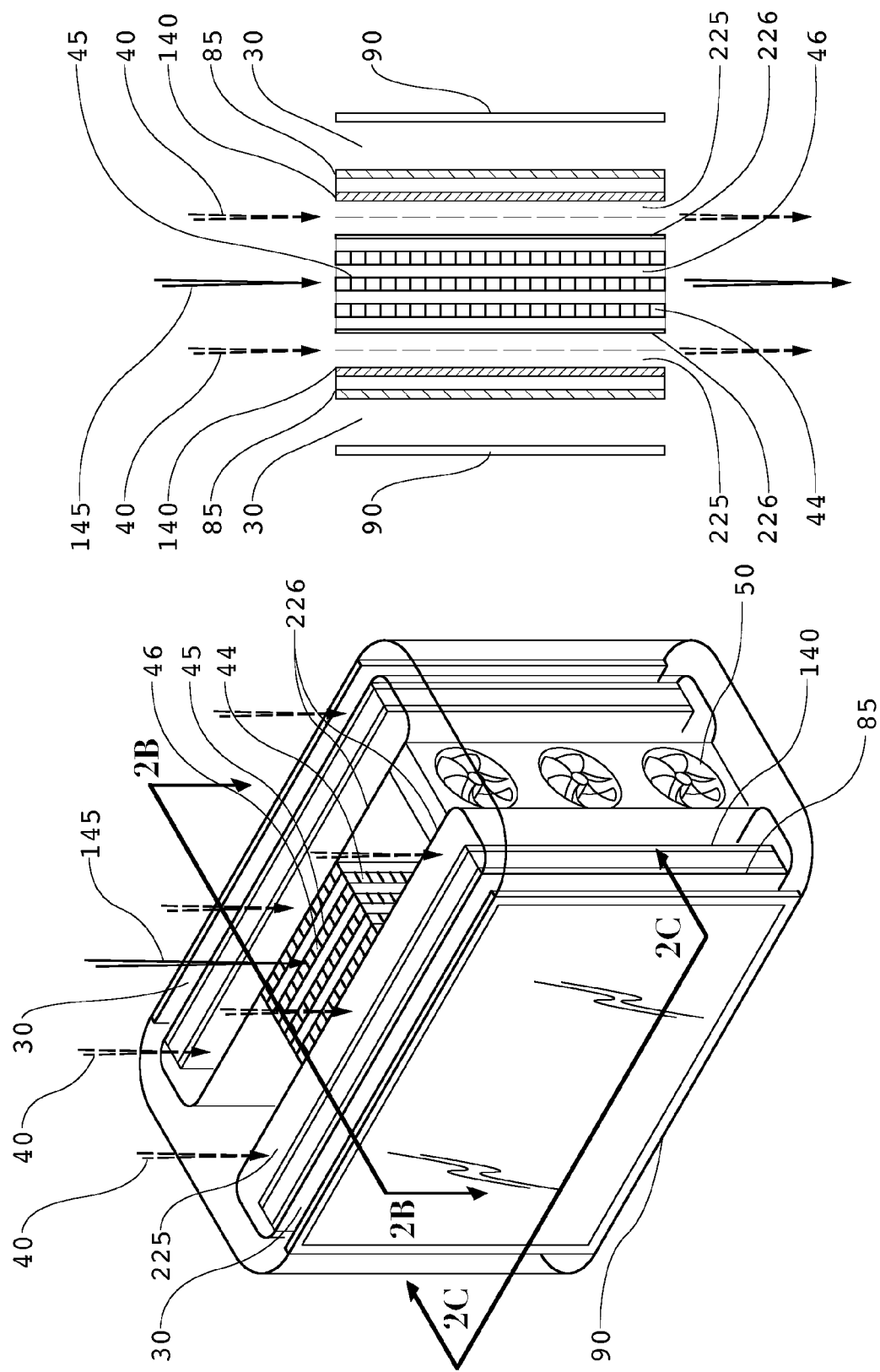

HEAT EXCHANGER FOR BACK TO BACK ELECTRONIC DISPLAYS

CROSS-REFERENCE TO RELATED APPLICATIONS

This application is a continuation of U.S. application Ser. No. 12/753,298 filed on Apr. 2, 2010. U.S. application Ser. No. 12/753,298 is a non-provisional application of U.S. Provisional Application No. 61/252,295 filed Oct. 16, 2009. U.S. application Ser. No. 12/753,298 is also a continuation-in-part of U.S. application Ser. No. 12/641,468 filed Dec. 18, 2009, which is a non-provisional application of U.S. Provisional Application No. 61/138,736 filed Dec. 18, 2008. U.S. application Ser. No. 12/753,298 is also a continuation-in-part of U.S. application Ser. No. 12/411,925 filed Mar. 26, 2009, which is a non-provisional of U.S. Provisional Application No. 61/039,454 filed Mar. 26, 2008. U.S. application Ser. No. 12/753,298 is also a continuation-in-part of U.S. application Ser. No. 12/556,029 filed Sep. 9, 2009, which is a non-provisional application of U.S. Provisional Application No. 61/095,615 filed Sep. 9, 2008. U.S. application Ser. No. 12/753,298 is also a continuation-in-part of U.S. application Ser. No. 12/234,307 filed Sep. 19, 2008, which is a non-provisional application of U.S. Provisional Application No. 61/033,064 filed Mar. 3, 2008. U.S. application Ser. No. 12/753,298 is also a continuation-in-part of U.S. application Ser. No. 12/234,360 filed Sep. 19, 2008, which is a non-provisional application of U.S. Provisional Application No. 61/053,713 filed May 16, 2008. U.S. application Ser. No. 12/753,298 is also a continuation-in-part of U.S. application Ser. No. 12/237,365 filed Sep. 24, 2008, which is a non-provisional application of U.S. Provisional Application No. 61/057,599 filed May 30, 2008. U.S. application Ser. No. 12/753,298 is also a continuation-in-part of U.S. application Ser. No. 12/235,200 filed Sep. 22, 2008, which is a non-provisional application of U.S. Provisional Application No. 61/076,126 filed Jun. 26, 2008. U.S. application Ser. No. 12/753,298 is also a continuation-in-part of U.S. application Ser. No. 12/620,330 filed Nov. 17, 2009, now U.S. Pat. No. 8,274,622, issued Sep. 25, 2012, which is a non-provisional application of U.S. Provisional Application No. 61/115,333 filed Nov. 17, 2008. U.S. application Ser. No. 12/753,298 is also a continuation-in-part of U.S. application Ser. No. 12/556,209 filed Sep. 9, 2009, which is a non-provisional application of U.S. Provisional Application No. 61/095,616 filed Sep. 9, 2008. U.S. application Ser. No. 12/753,298 is also a continuation-in-part of U.S. application Ser. No. 12/706,652 filed Feb. 16, 2010, which is a non-provisional application of U.S. Provisional Application No. 61/152,879 filed Feb. 16, 2009. U.S. application Ser. No. 12/753,298 is also a continuation-in-part of U.S. application Ser. No. 12/630,469 filed Dec. 3, 2009. U.S. application Ser. No. 12/753,298 is also a continuation-in-part of U.S. application Ser. No. 12/234,182 filed Sep. 19, 2008, which is a non-provisional application of U.S. Provisional Application No. 61/033,064 filed Mar. 3, 2008. All aforementioned applications are hereby incorporated by reference in their entirety as if fully cited herein.

TECHNICAL FIELD

The exemplary embodiments generally relate to cooling systems and in particular to cooling systems for electronic displays.

BACKGROUND OF THE ART

Electronic displays are now being used in outdoor environments and other applications where they may be exposed to high ambient temperatures and/or direct sunlight. In many climates, radiative heat transfer from the sun through a display window becomes a major factor. In many applications and locations 200 Watts or more of power through such a display window is possible. Furthermore, the market is demanding larger screen sizes for displays. With increased electronic display screen size and corresponding display window size more heat will be generated and more heat will be transmitted into the displays. Also, when displays are used in outdoor environments the ambient air may contain contaminates (dust, dirt, pollen, water vapor, smoke, etc.) which, if ingested into the display for cooling the interior can cause damage to the interior components of the display.

A large fluctuation in temperature is common in the devices of the past. Such temperature fluctuation adversely affects the electronic components in these devices; both performance and lifetime may be severely affected. Thus, there exists a need for a cooling system for electronic displays which are placed within environments having high ambient temperatures, possibly contaminates present within the ambient air, and even placed in direct sunlight.

SUMMARY OF THE EXEMPLARY EMBODIMENTS

Exemplary embodiments may comprise two separate flow paths for gas through an electronic display. A first flow path may be a closed loop and a second flow path may be an open loop. The closed loop path forces circulating gas across the front surface of the image assembly, continues behind the image assembly where it may enter a heat exchanger, finally returning to the front surface of the image assembly. The open loop path may draw ambient gas (ex. ambient air) through the display (sometimes through a heat exchanger, behind an image assembly, or both) and then exhaust it out of the display housing. A heat exchanger may be used to transfer heat from the circulating gas to the ambient gas. In alternative embodiments, the ambient gas may also be forced behind the image assembly (sometimes a backlight), in order to cool the image assembly and/or backlight assembly (if a backlight is necessary for the particular type of display being used). A crossflow heat exchanger may be used in an exemplary embodiment.

In an exemplary embodiment, two electronic displays are placed back-to-back and share a single heat exchanger. In this embodiment, two closed loop paths may travel though a single housing in order to cool the displays.

The foregoing and other features and advantages of the exemplary embodiments will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which:

FIG. 1 is an exploded view of an exemplary embodiment.

FIG. 2A is a perspective view of one embodiment for the back-to-back displays showing cutting planes B-B and C-C.

FIG. 2B is a section view along cutting plane B-B shown in FIG. 2A.

DETAILED DESCRIPTION

Figure 2C:
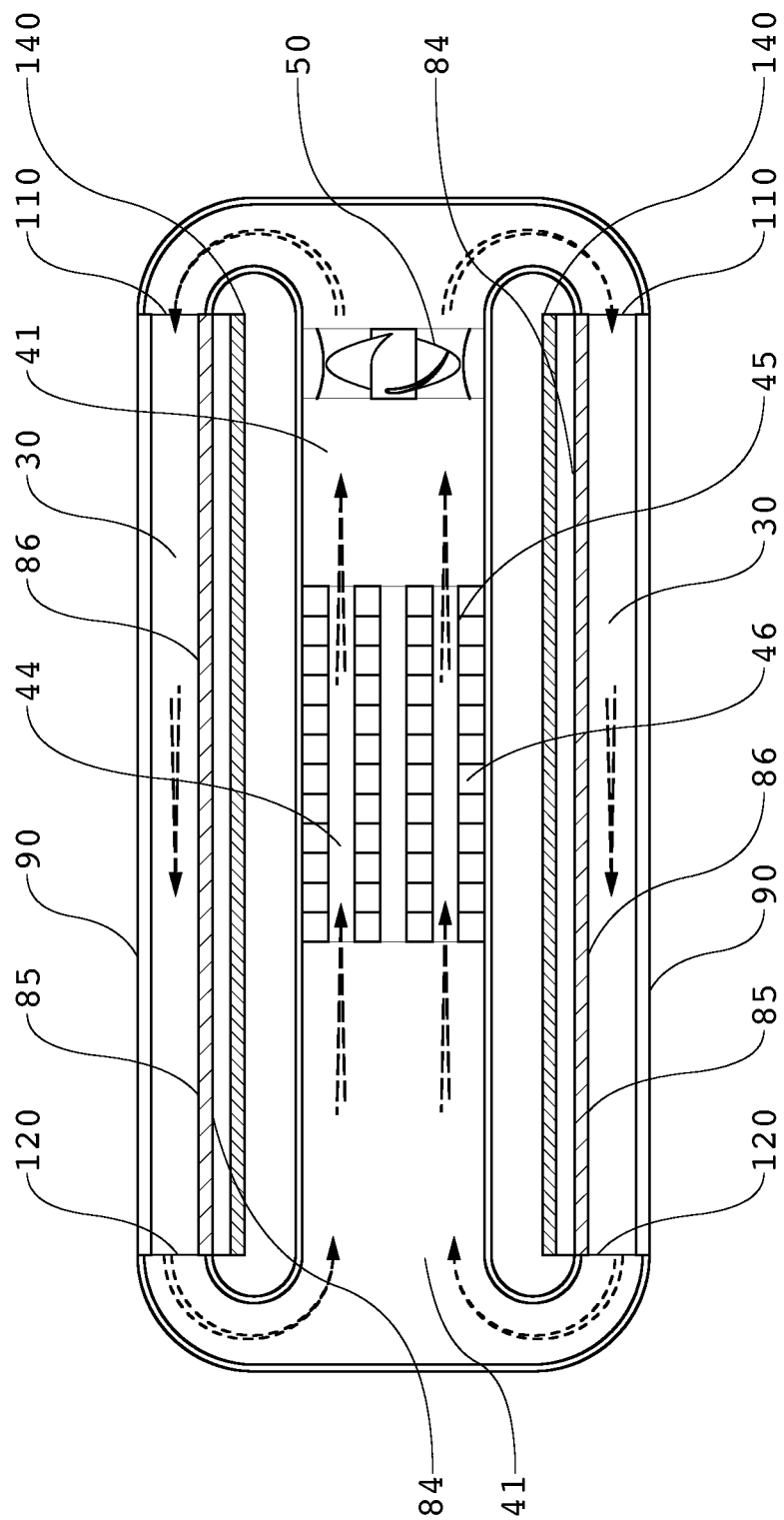
FIG. 2C is a section view along cutting plane C-C shown in FIG. 2A.

FIG. 1 provides an exploded view of an exemplary embodiment. In the exemplary embodiments, two electronic image assemblies are placed back to back in a substantially symmetrical manner. In this particular embodiment 10, LED backlit LCD displays are used but the techniques taught herein could be applied to any electronic assembly for generating an image, including but not limited to: light emitting diode (LED), organic light emitting diode (OLED), field emitting displays (FED), light-emitting polymers (LEP), plasma displays, and any other flat/thin panel displays. As shown in FIG. 1, each LCD assembly 85 has a front portion 86 and rear portion 84 where the front portion 86 produces the image and the rear portion 84 faces the oppositely-facing LCD assembly 85. A LED backlight 140 is placed adjacent to the rear portion 84 of the LCD assemblies 85, as is known in the art. Edge-lit LED backlights or direct-lit LED backlights could be used with the various embodiments herein. For the particular embodiment shown in FIG. 1, a direct-lit LED backlight is preferable.

The exemplary embodiment shown in FIG. 1 can cool various portions of the assembly shown, including but not limited to the rear surfaces of the LED backlights 140. Ambient gas 40 may be drawn into the display housing 70 through the inlet apertures 179 and forced along the rear surface of the LED backlights 140. The fan assembly 60 may be used to draw the ambient gas 40 into the display housing 70 and along the rear surface of the LED backlights 140. Although shown at the bottom of the display housing 70, the fan assembly 60 can be placed anywhere in the assembly. For example, fans could also be placed at the top of the housing 70 either instead of or in addition to the ones shown at the bottom in FIG. 1. Further, the fans may draw the ambient air from below the housing, above the housing, or from the sides.

In this embodiment, a heat exchanger 45 is placed between the two backlights 140. A protective transparent plate 90 may be placed in front of the front portion of the LCD assembly 85. The space between the protective transparent plate 90 and the LCD assembly defines a channel where circulating gas may travel in order to cool the front portion 86 of the LCD assembly 85. The circulating gas then travels through a first pathway 44 of the heat exchanger 45 in order to be cooled by the ambient gas 145. The circulating gas may be forced through the channel and the heat exchanger 45 by closed loop fan assembly 50. Ambient gas 145 may be directed through a second pathway 46 of the heat exchanger 45. The ambient gas 145 may be forced through the heat exchanger 45 by the fans 60 or may be forced using a separate fan 245, controlled specifically for the heat exchanger 45. The protective transparent plate 90 may be any rigid transparent material. Exemplary embodiments may use glass for the plate 90. Further embodiments may combine anti-reflective layers and/or polarizers with the plate 90 to reduce the amount of reflected light. Ideally, these could be bonded to a plate of glass using pressure sensitive adhesive (PSA) and would preferably be index-matched. In some embodiments, the plate 90 may comprise two or more pieces of glass bonded together with index-matching optical adhesive.

FIG. 2A provides a perspective view of an embodiment with the housing removed and showing the plates 90 installed in front of the LCD assemblies 85. This figure shows the placement for cutting planes B-B and C-C which provide the section views in FIGS. 2B and 2C respectively. Cutting plane B-B passes vertically down the center of the assembly and through the heat exchanger 45. Cutting plane C-C passes horizontally through the center of the assembly.

A second surface 226 may be placed behind the rear surface of each of the backlights 140. The space between the rear surface of the backlight 140 and this second surface 226 may define an open loop channel 225 through which the ambient gas 40 may travel in order to cool the backlight 140 (or the electronic image assembly if no backlight is used). Exemplary embodiments of the LED backlights 140 would have a low level of thermal resistance between the front surface containing the LEDs and the rear surface which faces the second surface 226 and is in contact with the ambient gas 40. A metallic PCB may be used as the mounting structure for this purpose. The rear surface of the backlight 140 may contain a thermally conductive material, such as a metal. Aluminum may be an exemplary material for the rear surface.

FIG. 2B provides the section view from cutting plane B-B shown in FIG. 2A. In this particular embodiment, ambient gas 145 travels through the heat exchanger 45 while ambient gas 40 travels through the open loop channels 225. Thus, ambient gas 145 may be used to remove heat from the circulating gas and ambient gas 40 may be used to remove heat from the LED backlight 140. As can be readily observed in this view, the LED backlight 140 and LCD assembly 85 could easily be substituted with any other electronic image assembly (such as those listed above or below). It should be noted that there is no requirement that ambient gas 145 and 40 be different in any way. For example, both ambient gas 145 and 40 may enter through the same inlet in the housing and even be exhausted out of the same exhaust aperture in the housing. Further, a single fan assembly can force both ambient gas 145 and 40. They are simply shown with different numeral callouts so that one can see the separate passages for the ambient gas (i.e. one through the heat exchanger 45 and another through the optional open loop channels 225). As will be discussed further below, the open loop channels 225 are not required for all embodiments. This is especially true for electronic displays that do not require a backlight or displays which contain a backlight that does not produce relatively large amounts of heat. It is specifically contemplated that OLED displays could be used where only ambient gas 145 would be drawn into the display and through the heat exchanger 45 (although ambient gas could be used to cool other portions of the display, open loop channels 225 may not be required with OLED embodiments).

FIG. 2C provides the section view from cutting plane C-C shown in FIG. 2A. The circulating gas preferably travels in a closed loop where it is drawn through the first gas pathway 44 of the heat exchanger 45 and then directed into the entrances 110 of the channels 30. As discussed above, the channels 30 may be defined by the space between the front surface of the LCD assembly 85 (or other electronic image assembly) and the transparent plate 90. As mentioned above, sunlight (or high ambient surrounding temperatures) can cause a buildup of heat on the LCD assembly 85. As the circulating gas travels through the channel 30, it may remove heat from the front surface of the LCD assembly 85. The circulating gas may then be directed out of the channel 30 through the exit 120. The circulating gas may then be re-directed into the first gas pathway 44 of the heat exchanger 45 so that it may be cooled by the ambient gas 145 (which may be travelling through the second gas pathway 46 of the heat exchanger 45).

The closed loop fan assembly 50 may be placed so that the circulating gas will be forced through this closed loop. While the figure shows the placement of the fan assembly 50 after and away from the heat exchanger 45, it should be noted that the fan assembly 50 could be placed anywhere in the system so that adequate velocity and flow of the circulating gas is achieved. Thus, some embodiments could even use two or more fan assemblies, placing them along two opposing edges (entrance and exit) of a heat exchanger 45. The circulating gas could be 'pulled' across the front of the electronic image assembly and 'pushed' through the heat exchanger 45. This is not required however; other embodiments may pull the isolated gas through the heat exchanger 45 and 'push' it through the channel 30. Other embodiments may push the isolated gas only across the front of the electronic image assembly. Because the various fan assemblies described herein can be placed in multiple orientations, when referring to the placement of the various fan assemblies, the terms 'push', 'pull', 'force', and 'draw' will be used interchangeably and any orientation may be used with the various embodiments herein.

Various electronic components could be placed within the path of the circulating gas by placing them within cavity 41 which includes the heat exchanger 45. The circulating gas may be used to extract heat from these devices as well. The electronic components may be any components or assemblies used to operate the display including, but not limited to: transformers, circuit boards, resistors, capacitors, batteries, power modules, motors, inductors, transformers, illumination devices, wiring and wiring harnesses, lights, thermoelectric devices, and switches. In some embodiments, the electrical components may also include heaters, if the display assembly is used in cold-weather environments.

In some embodiments, the ambient gas 145 and 40 may be air conditioned (or otherwise cooled) prior to being drawn through the heat exchanger 45. This is not required however; as it has been found that proper design of the heat exchanger 45 and other various components can provide adequate cooling in most environments without additional air conditioning.

Although not required, it is preferable that the circulating gas and ambient gas 145 do not mix. This may prevent any contaminates and/or particulate that is present within the ambient gas 145 from harming the interior of the display. In a preferred embodiment, the heat exchanger 45 would be a cross-flow heat exchanger. However, many types of heat exchangers are known and can be used with any of the embodiments herein. The heat exchanger 45 may be a cross-flow, parallel flow, or counter-flow heat exchanger. In an exemplary embodiment, the heat exchanger 45 would be comprised of a plurality of stacked layers of thin plates. The plates may have a corrugated, honeycomb, or tubular design, where a plurality of channels/pathways/tubes travel down the plate length-wise. The plates may be stacked such that the directions of the pathways are alternated with each adjacent plate, so that each plate's pathways are substantially perpendicular to the pathways of the adjacent plates. Thus, ambient gas or circulating gas may enter an exemplary heat exchanger only through plates whose channels or pathways travel parallel to the path of the gas. Because the plates are alternated, the circulating gas and ambient gas may travel in plates which are adjacent to one another and heat may be transferred between the two gases without mixing the gases themselves (if the heat exchanger is adequately sealed, which is preferable but not required).

In an alternative design for a heat exchanger, an open channel may be placed in between a pair of corrugated, honeycomb, or tubular plates. The open channel may travel in a direction which is perpendicular to the pathways of the adjacent plates. This open channel may be created by running two strips of material or tape (esp. very high bond (VHB) tape) between two opposite edges of the plates in a direction that is perpendicular to the direction of the pathways in the adjacent plates. Thus, gas entering the heat exchanger in a first direction may travel through the open channel (parallel to the strips or tape). Gas which is entering in a second direction (substantially perpendicular to the first direction) would travel through the pathways of the adjacent plates).

Other types of cross-flow heat exchangers could include a plurality of tubes which contain the first gas and travel perpendicular to the path of the second gas. As the second gas flows over the tubes containing the first gas, heat is exchanged between the two gases. Obviously, there are many types of cross-flow heat exchangers and any type would work with the embodiments herein.

An exemplary heat exchanger may have plates where the sidewalls have a relatively low thermal resistance so that heat can easily be exchanged between the two gases. A number of materials can be used to create the heat exchanger. Preferably, the material used should be corrosion resistant, rot resistant, light weight, and inexpensive. Metals are typically used for heat exchangers because of their high thermal conductivity and would work with these embodiments. However, it has been discovered that plastics and composites can also satisfy the thermal conditions for electronic displays. An exemplary embodiment would utilize polypropylene as the material for constructing the plates for the heat exchanger. It has been found that although polypropylene may seem like a poor thermal conductor, the large amount of surface area relative to a small sidewall thickness, results in an overall thermal resistance that is very low. Thus, an exemplary heat exchanger would be made of plastic and would thus produce a display assembly that is thin and lightweight. Specifically, corrugated plastic may be used for each plate layer where they are stacked together in alternating fashion (i.e. each adjacent plate has channels which travel in a direction perpendicular to the surrounding plates).

The circulating gas and ambient gas can be any number of gaseous matters. In some embodiments, air may be used as the gas for both. Preferably, the circulating gas should be substantially clear, so that when it passes in front of the electronic image assembly it will not affect the appearance of the image to a viewer. The circulating gas would also preferably be substantially free of contaminates and/or particulate (ex. dust, dirt, pollen, water vapor, smoke, etc.) in order to prevent an adverse effect on the image quality and damage to the internal electronic components. It may sometimes be preferable to keep the ambient gas within the open loop from having contaminates as well. An optional filter may be used to ensure that the air (either in the closed or open loop) stays free of contaminates. However, in an exemplary embodiment the open loops (channels 225 and the second gas pathway 46 through the heat exchanger 45) may be designed so that contaminates could be present within the ambient gas 145 or 40 but this will not harm the display. In these embodiments, the heat exchanger 45 (and the optional channels 225) should be properly sealed so that any contaminates in the ambient gas 145 or 40 would not enter sensitive portions of the display. Thus, in these exemplary embodiments, ingesting ambient air for the ambient gas 145 or 40, even if the ambient air contains contaminates, will not harm the display. This can be particularly beneficial when the display is used in outdoor environments or indoor environments where contaminates are present in the ambient air.

Figures 3A, 3B:
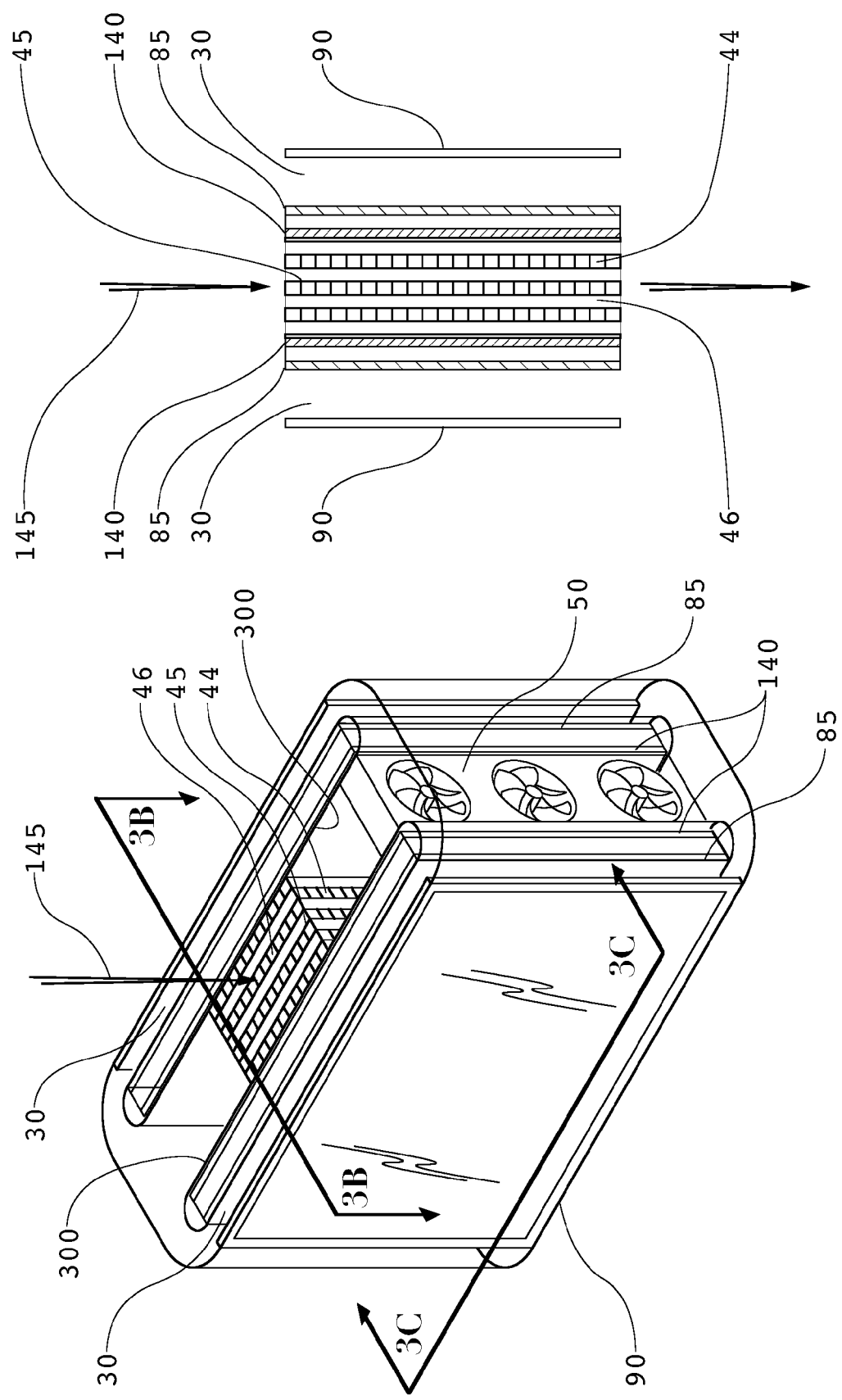
FIG. 3A is a perspective view of another embodiment for the back-to-back displays showing cutting planes B-B and C-C.
FIG. 3B is a section view along cutting plane B-B shown in FIG. 3A.

FIG. 3A provides a perspective view of another embodiment where the housing has been removed. In this embodiment, the previously-shown open loop channels 225 behind the backlight 140 are not used. This figure shows the placement for cutting planes B-B and C-C which provide the section views in FIGS. 3B and 3C respectively. Cutting plane B-B passes vertically down the center of the assembly and through the heat exchanger 45. Cutting plane C-C passes horizontally through the center of the assembly.

FIG. 3B provides the section view from cutting plane B-B shown in FIG. 3A. In this particular embodiment, ambient gas 145 only travels through the heat exchanger 45. Thus, only ambient gas 145 may be used to remove heat from the circulating gas. As can be readily observed in this view, the LED backlight 140 and LCD assembly 85 could easily be substituted with any other electronic image assembly (such as those listed above or below). In some embodiments, the electronic image assembly could be placed in conductive thermal communication with the heat exchanger 45 so that the heat from the electronic image assembly could be distributed into the heat exchanger 45 and removed by ambient gas 145. Thus, in some embodiments the backlight 140 could have thermal communication with the heat exchanger 45. The thermal communication would preferably be conductive thermal communication.

Figure 3C:
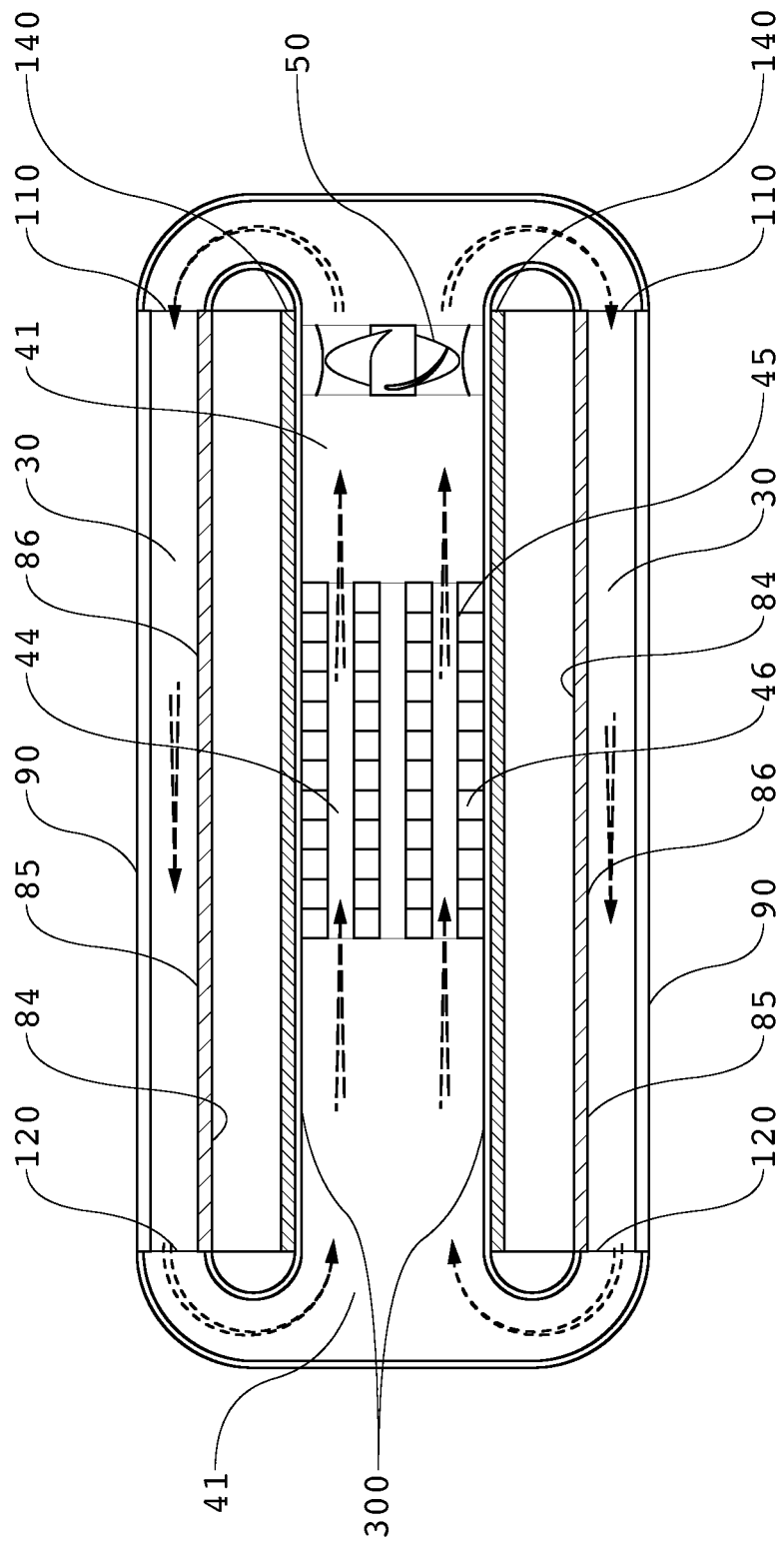
FIG. 3C is a section view along cutting plane C-C shown in FIG. 3A.

FIG. 3C provides the section view from cutting plane C-C shown in FIG. 3A. The circulating gas preferably travels in a closed loop where it is drawn through the first gas pathway 44 of the heat exchanger 45 and then directed into the entrances 110 of the channels 30. As discussed above, the channels 30 may be defined by the space between the front surface of the LCD assembly 85 (or other electronic image assembly) and the transparent plate 90. As mentioned above, sunlight (or high ambient surrounding temperatures) can cause a buildup of heat on the LCD assembly 85. As the circulating gas travels through the channel 30, it may remove heat from the front surface of the LCD assembly 85. The circulating gas may then be directed out of the channel 30 through the exit 120. The circulating gas may then be re-directed into the first gas pathway 44 of the heat exchanger 45 so that it may be cooled by the ambient gas 145 (which is travelling through the second gas pathway 46 of the heat exchanger 45).

A pair of plates 300 (or surfaces) may be used to define the cavity 41 (or channel) which contains the heat exchanger 45 and the circulating gas as it travels behind the electronic image assemblies. In some embodiments, the rear portions of the electronic image assemblies (sometimes containing a backlight and sometimes not) may be placed in thermal communication with the plates 300 so that heat may be transferred from the image assemblies to the plates 300 and eventually to the circulating gas (where it can then be removed as it passes through the heat exchanger 45). The thermal communication between the electronic image assemblies and the plates 300 should preferably be conductive thermal communication. The plates 300 could also be placed in conductive thermal communication with the heat exchanger 45. Thus, if using the LED backlights 140 these could be placed in conductive thermal communication with the plates 300. The plates should preferably have a low thermal resistance. A metallic substance may provide a good material for the plates 300. Aluminum would be an exemplary choice for plates 300.

As mentioned above, various electronic components could be placed within the path of the circulating gas by placing them within cavity 41 (or channel) which includes the heat exchanger 45. The circulating gas may be used to extract heat from these devices as well. The electronic components may be any components or assemblies used to operate the display including, but not limited to: transformers, circuit boards, resistors, capacitors, batteries, power modules, motors, inductors, transformers, illumination devices, wiring and wiring harnesses, lights, thermo-electric devices, and switches. In some embodiments, the electrical components may also include heaters, if the display assembly is used in cold-weather environments.

The embodiment shown in FIGS. 3A-3C may be used for a variety of applications. First, this embodiment may be preferable if the electronic image assembly being used does not require a backlight or does not produce a relatively large amount of heat from the rear side of the image assembly. Second, size or footprint may be an issue and this embodiment is thinner and possibly lighter than the embodiments that use the open channels 225. Costs can also be reduced as the additional fans/power supplies/controllers for ingesting ambient air 40 are no longer required. Specifically, the embodiment shown in FIGS. 3A-3C may be preferable for OLED applications or edge-lit LED backlit LCD applications. However, even the direct-lit LED backlight LCD designs could use this embodiment if the application allows. One example would be if high-efficiency LEDs are used for the backlight. Further, this embodiment could be used if the display is only subjected to direct sunlight but relatively low ambient temperatures.

The cooling system described herein may run continuously. However, if desired, temperature sensing devices (not shown) may be incorporated within the electronic display to detect when temperatures have reached a predetermined threshold value. In such a case, the various cooling fans may be selectively engaged when the temperature in the display reaches a predetermined value. Predetermined thresholds may be selected and the system may be configured to advantageously keep the display within an acceptable temperature range. Typical thermostat assemblies can be used to accomplish this task. Thermocouples may be used as the temperature sensing devices. The speed of the various fan assemblies can also be varied depending on the temperature within the display.

It should be particularly noted that the spirit and scope of the disclosed embodiments provides for the cooling of any type of electronic display. By way of example and not by way of limitation, embodiments may be used in conjunction with any of the following: LCD (all types), light emitting diode (LED), organic light emitting diode (OLED), field emitting display (FED), light emitting polymer (LEP), organic electro luminescence (OEL), plasma displays, and any other type of thin/flat panel display. Furthermore, embodiments may be used with displays of other types including those not yet discovered. In particular, it is contemplated that the system may be well suited for use with large (40 inches or more) LED backlit, high definition (1080i or 1080p or greater) liquid crystal displays (LCD). While the embodiments described herein are well suited for outdoor environments, they may also be appropriate for indoor applications (e.g., factory/industrial environments, spas, locker rooms, kitchens, bathrooms) where thermal stability of the display may be at risk.

It should also be noted that the variety of open and closed cooling loops that are shown in the figures may be shown in a horizontal or vertical arrangement but it is clearly contemplated that this can be reversed or changed depending on the particular embodiment. Thus, the closed loop may run horizontally or vertically and in a clock-wise or counter-clockwise direction. Further, the open loop may also be horizontal or vertical and can run left to right, right to left, and top to bottom, or bottom to top.

It should also be noted that electronic image assemblies do not have to be used on both sides of the display. For example, one side may include an OLED display while the opposing side may be a static advertisement. Further, the same type of electronic image assembly does not have to be used on both sides of the display. For example, one side may contain an LED display while the second side contains an OLED display.

Having shown and described preferred embodiments, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

The invention claimed is:

1. A cooling subassembly for back-to-back electronic image assemblies, each electronic image assembly having a front and rear portion where the rear portions are facing one another, the assembly comprising:
    a housing which contains the two electronic image assemblies;
    a heat exchanger positioned entirely within the housing that contains the two electronic image assemblies and having first and second pathways for gas where the gas travelling through the second pathway is ingested into the housing but is not permitted to mix with the gas travelling through the first pathway; and
    a transparent channel positioned adjacent to the front portion of each electronic image assembly;
    wherein both channels are in gaseous communication with the first gas pathway in the heat exchanger.

2. The cooling subassembly of claim 1 further comprising:
    a first fan positioned to draw circulating gas through the channels and the first gas pathway in the heat exchanger; and
    a second fan positioned to force cooling gas through the second gas pathway in the heat exchanger.

3. The cooling subassembly of claim 1 wherein:
    the heat exchanger is a cross-flow heat exchanger.

4. The cooling subassembly of claim 1 further comprising:
    a surface spaced apart from the rear portion of each electronic image assembly; and
    a second pair of channels defined by the space between the surfaces and the rear portion of the electronic image assemblies.

5. The cooling subassembly of claim 4 further comprising:
    a first fan positioned to draw circulating gas through the channels and the first gas pathway in the heat exchanger; and
    a second fan positioned to force cooling gas through the second gas pathway in the heat exchanger and through the second pair of channels.

6. The cooling subassembly of claim 1 wherein:
    the front display surfaces each comprise a glass panel with a linear polarizer.

7. The cooling subassembly of claim 1 wherein:
    the front display surfaces each comprise two glass panels bonded together with optical adhesive.

8. The cooling subassembly of claim 1 wherein:
    the heat exchanger is comprised of several layers of corrugated plastic.

9. A back-to-back electronic display assembly comprising:
    a pair of electronic image assemblies, each assembly having a front and a rear portion and placed so that the rear portions are facing one another;
    a thermally conductive plate attached to the rear portions of each electronic image assembly, where the space between the two plates defines a chamber;
    a heat exchanger positioned within the chamber and having first and second gas pathways;
    a transparent channel positioned at the front portion of each electronic image assembly and in gaseous communication with the first gas pathway of the heat exchanger to form a closed gaseous loop; and
    a first fan assembly placed within the closed gaseous loop; and
    a second fan assembly positioned to force cooling air through the second gas pathway of the heat exchanger.

10. The back-to-back electronic display assembly of claim 9 wherein:
    the heat exchanger is a cross-flow heat exchanger.

11. The back-to-back electronic display assembly of claim 9 wherein:
    each electronic image assembly comprises a liquid crystal display having an LED backlight positioned in the rear portion of the image assembly.

12. The back-to-back electronic display assembly of claim 9 wherein:
    the transparent channels are oriented horizontally.

13. The back-to-back electronic display assembly of claim 9 wherein:
    the heat exchanger is metallic.

14. The back-to-back electronic display assembly of claim 9 wherein:
    the heat exchanger is comprised of several layers of plastic.

15. The back-to-back electronic display assembly of claim 9 wherein:
    the image assembly is an OLED display.

16. A back-to-back electronic display assembly comprising:
    two electronic display assemblies placed back-to-back, each assembly comprising:
        a liquid crystal display (LCD) having an LED backlight,
        a transparent front display surface spaced apart from the LCD,
        a front channel defined by the space between the front display surface and the LCD,
        a plate positioned behind the LED backlight, and
        a rear channel defined by the space between the LED backlight and the plate;
    a heat exchanger having first and second gas pathways, where the first pathway is in gaseous communication with the front channels of both display assemblies;
    a first fan positioned so as to force circulating gas through the front channels and the first gas pathway of the heat exchanger; and
    a second fan positioned so as to force cooling gas through the rear channels and the second gas pathway of the heat exchanger.

17. The back-to-back electronic display assembly of claim 16 wherein:
    the heat exchanger is a cross-flow heat exchanger comprised of corrugated plastic.

18. The back-to-back electronic display assembly of claim 16 wherein:
    the LED backlights are direct-lit LED backlights.

19. The back-to-back electronic display assembly of claim 16 wherein:
    the front channels are oriented horizontally.

20. The back-to-back electronic display assembly of claim 16 wherein:
    the first and second gas pathways of the heat exchanger are perpendicular to one another.

* * * * *